United States Patent
Lee

(12) United States Patent (10) Patent No.: US 7,859,280 B2
Lee (45) Date of Patent: Dec. 28, 2010

(54) PROBE CARD FOR TESTING SEMICONDUCTOR DEVICES

(75) Inventor: Han-Moo Lee, Seoul (KR)

(73) Assignee: Phicom Corporation, Seoul (KR)

( * ) Notice: Subject to any disclaimer, the term of this patent is extended or adjusted under 35 U.S.C. 154(b) by 0 days.

(21) Appl. No.: 11/921,336

(22) PCT Filed: Jun. 1, 2006

(86) PCT No.: PCT/KR2006/002100

§ 371 (c)(1),
(2), (4) Date: Mar. 26, 2009

(87) PCT Pub. No.: WO2006/129971

PCT Pub. Date: Dec. 7, 2006

(65) Prior Publication Data

US 2009/0212797 A1 Aug. 27, 2009

(30) Foreign Application Priority Data

Jun. 2, 2005 (KR) .................. 10-2005-0047332

(51) Int. Cl.
*G01R 31/02* (2006.01)
(52) U.S. Cl. .................. 324/754; 324/757; 324/758
(58) Field of Classification Search .................. None
See application file for complete search history.

(56) References Cited

U.S. PATENT DOCUMENTS 6,441,629 B1 8/2002 Khoury et al.
6,476,626 B2 11/2002 Aldaz et al.
7,075,319 B2 * 7/2006 Mori .................. 324/754
7,081,766 B2 * 7/2006 Satou et al. .................. 324/754

(Continued)

FOREIGN PATENT DOCUMENTS

DE 102004028185 A1 3/2005

(Continued)

OTHER PUBLICATIONS

International Search Report and Written Opinion for PCT/KR2006/002100 dated Aug. 26, 2006.

*Primary Examiner*—Minh N Tang
(74) *Attorney, Agent, or Firm*—Jenkins, Wilson, Taylor & Hunt, P.A.

(57) ABSTRACT

A probe card is disclosed that is easily assembled and maintained and configured to prevent the controlled level of a space transformer from changing due to various causes such as a thermal deformation during a test process. The probe card includes an installation member where probe tips are provided and a printed circuit board (PCB) disposed on the installation member. A reinforcement member is fixed to a top surface of the PCB, and a contact member is disposed between the PCB and the reinforcement member. The contact member and the installation member are fixed by a connect member inserted into an insert hole formed at the PCB, and a control bolt provided for controlling the level of the installation member is inserted into control holes formed at the installation member, the PCB, and the reinforcement member sequentially in a bottom-to-top direction. Due to a convex-up top surface of the contact member, the contact member continues to contact the reinforcement member even though the installation member and the contact member are inclined while controlling the level of the installation member.

7 Claims, 5 Drawing Sheets

U.S. PATENT DOCUMENTS

2002/0190740 A1    12/2002    Ishizaka et al.
2005/0156611 A1 *  7/2005     Shinde et al.  ............... 324/754

FOREIGN PATENT DOCUMENTS

| | | |
|---|---|---|
| EP | 1 391 738 A2 | 2/2004 |
| JP | 01-269065 A | 10/1989 |
| JP | 2002-022767 A | 1/2002 |
| JP | 2003-324132 A | 11/2003 |
| JP | 2004-077153 A | 3/2004 |
| JP | 2005-069702 A | 3/2005 |
| KR | 201998 0026664 | 8/1998 |
| KR | 102002 00098674 | 12/2002 |
| KR | 2003-25293 | 3/2003 |
| TW | 0548417 B | 8/2003 |
| WO | WO 02/15260 | 2/2002 |

* cited by examiner

[Fig. 1]
(CONVENTIONAL ART)
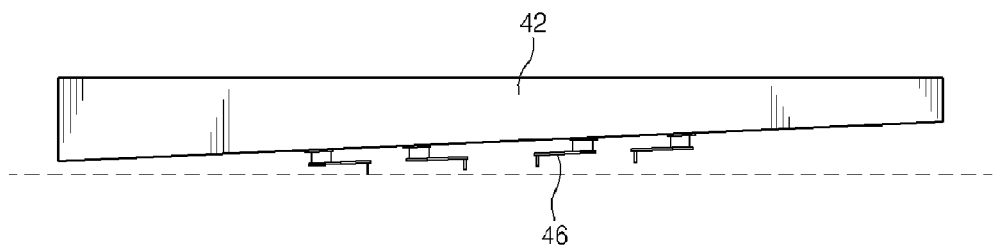
[Fig. 2]
(CONVENTIONAL ART)
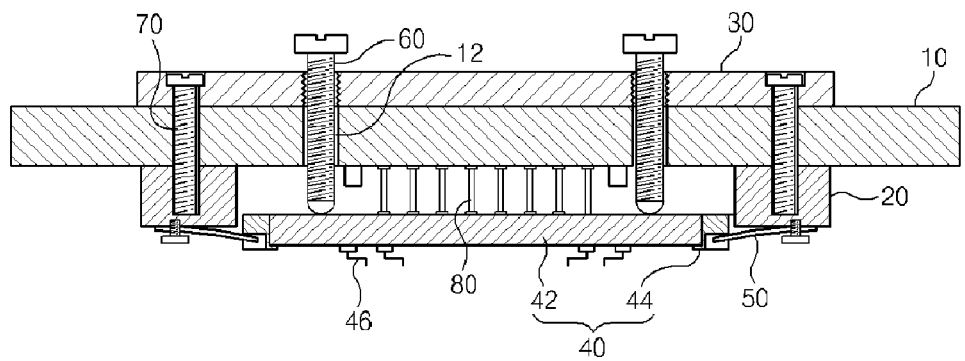
[Fig. 3]
(CONVENTIONAL ART)
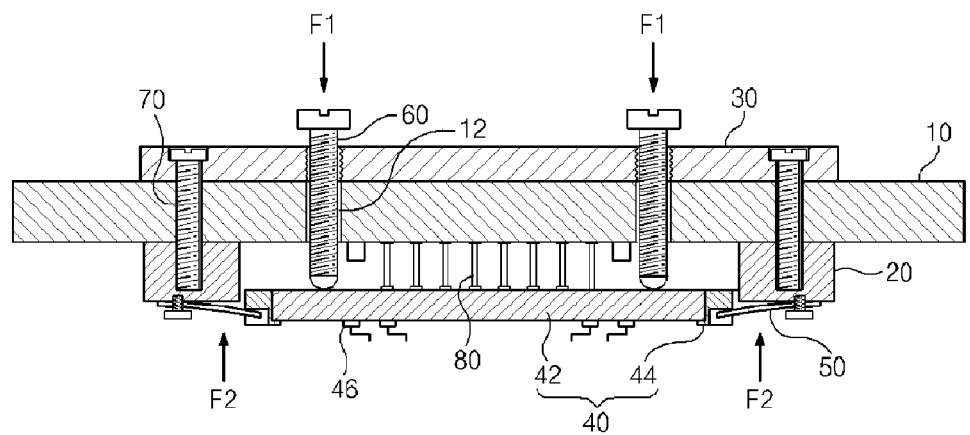

[Fig. 4]
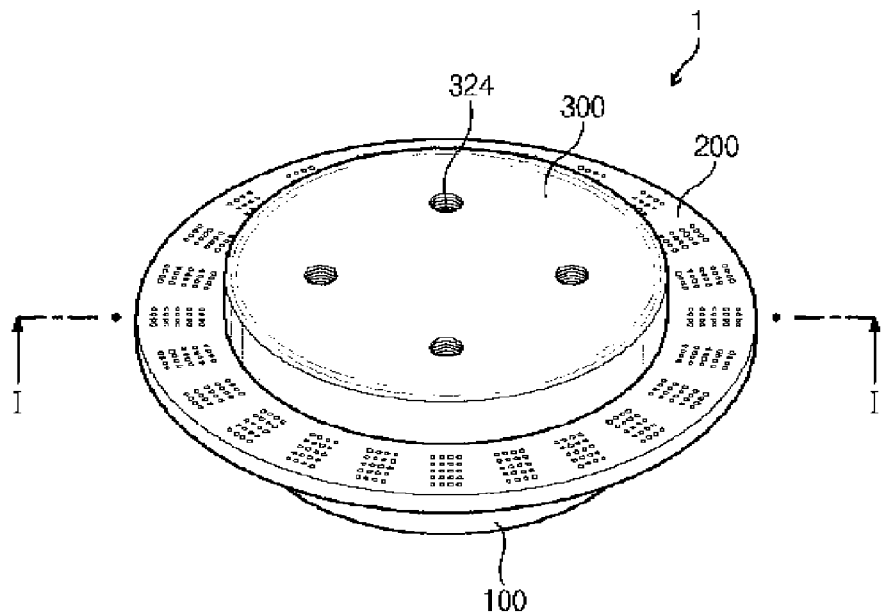
[Fig. 5]
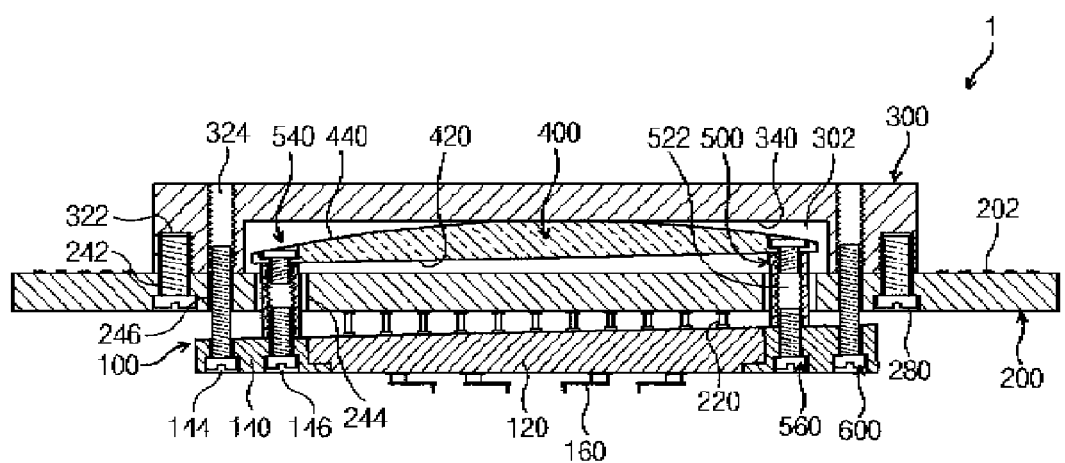

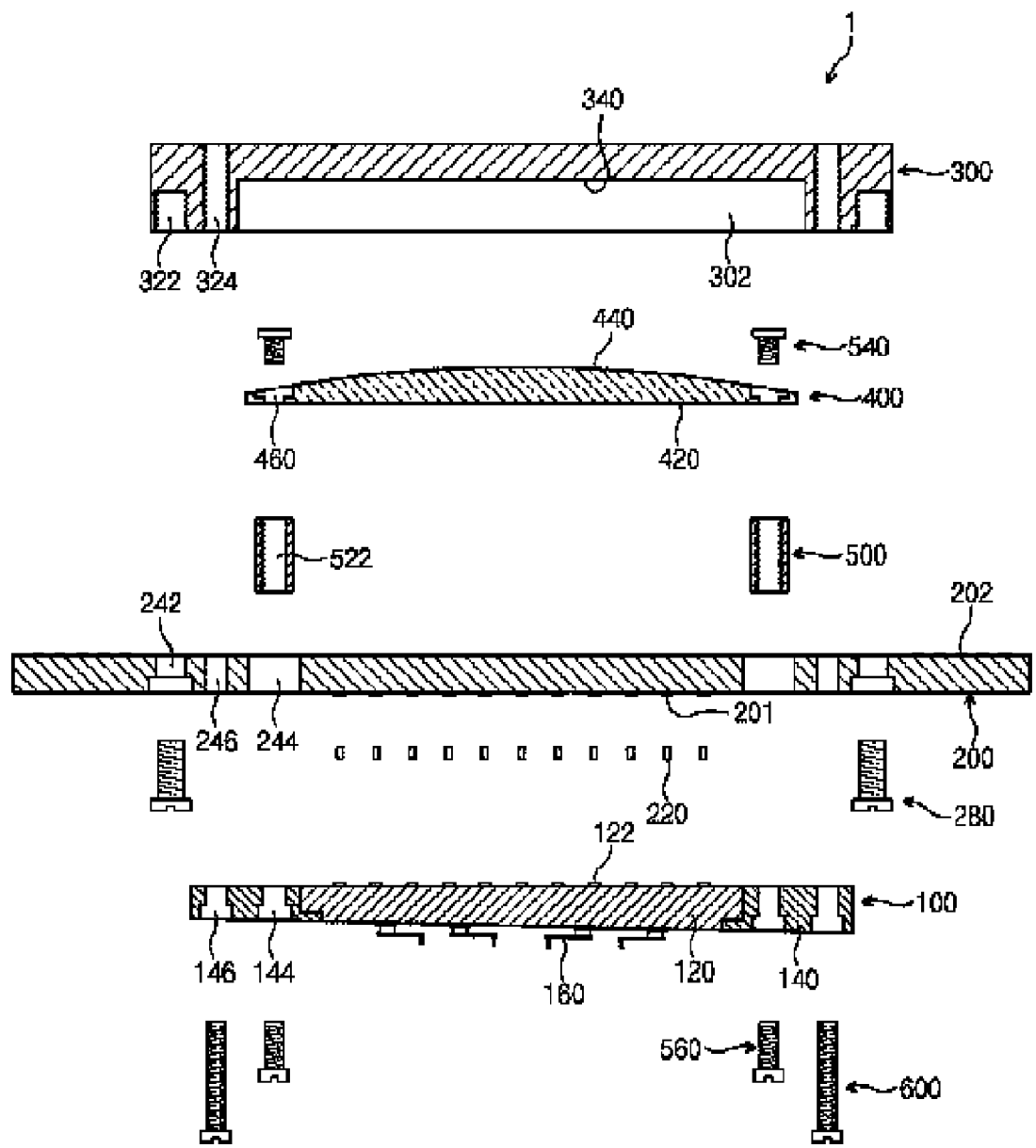
[Fig. 6]
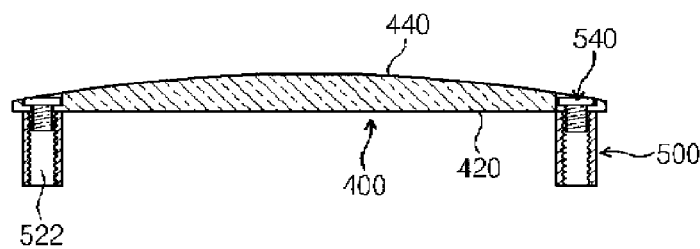
[Fig. 7]

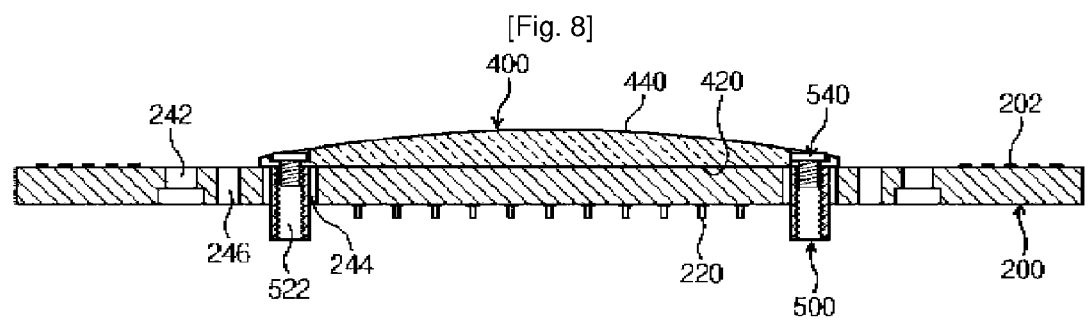
[Fig. 8]
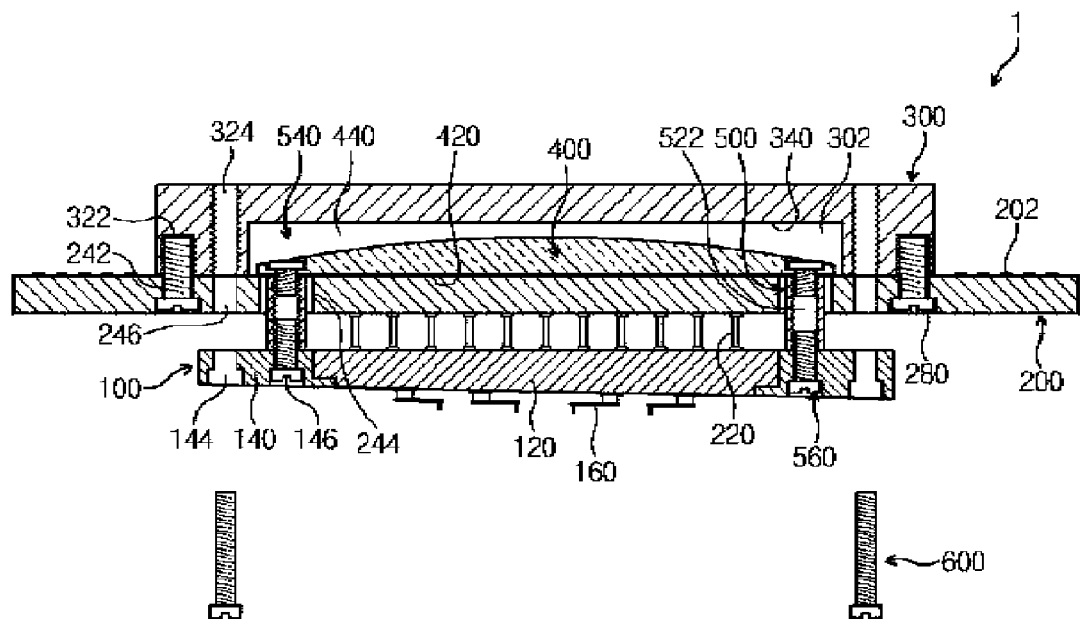
[Fig. 9]
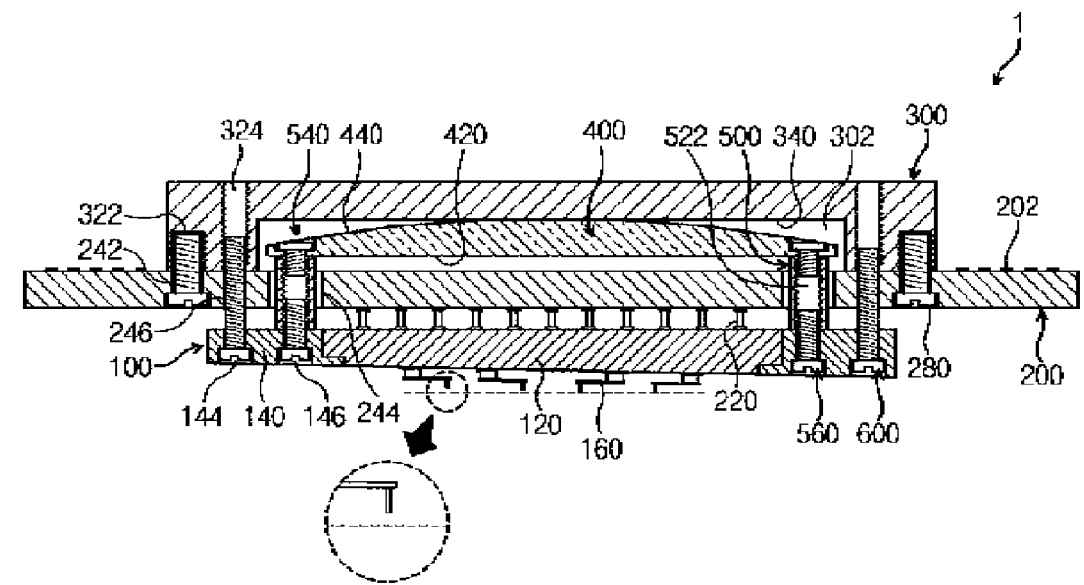
[Fig. 10]

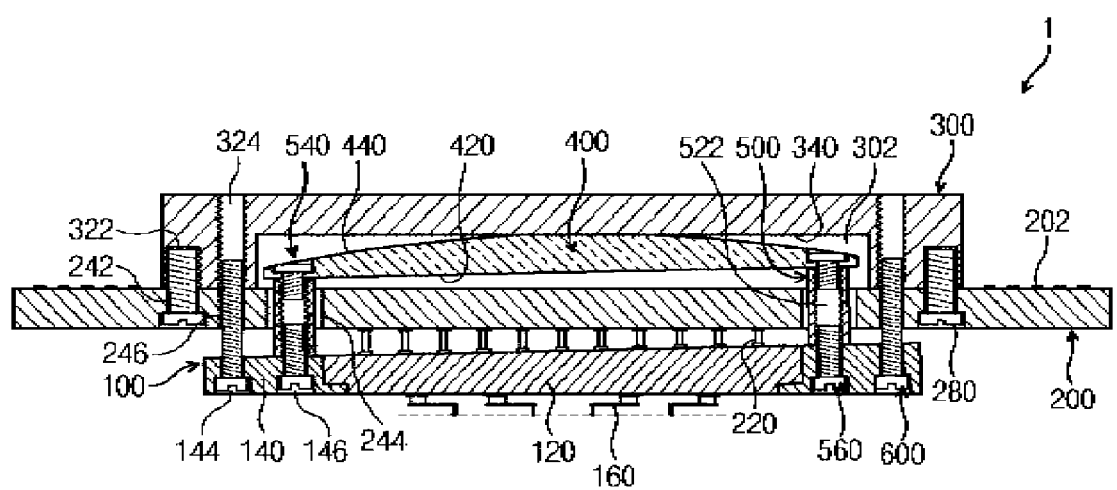
[Fig. 11]

PROBE CARD FOR TESTING SEMICONDUCTOR DEVICES

TECHNICAL FIELD

The present invention relates to test equipments of semiconductor wafers and, more particularly, to probe cards used to test electric characteristics of semiconductor chips.

BACKGROUND ART

In general, semiconductor products are manufactured by performing a complex series of processes such as a process of manufacturing a pure silicon wafer, a process of forming patterns on the pure silicon wafer to fabricate semiconductor chips, an electric die sorting (EDS) process of testing electric characteristics of the semiconductor chips to determine whether the semiconductor chips are good or bad, a process of packaging good semiconductor chips, and a process of finally testing the packaged semiconductor chips.

Among chips determined to be bad through an electric characteristic test process, repairable chips are repaired while non-repairable chips are eliminated before performing an assembly process. Thus, the electric characteristic test process is significant in reducing assembly cost and enhancing a yield of a semiconductor chip fabricating process.

An apparatus for performing an EDS process includes a probe card with probe tips, which are in contact with a conductive pad provided for a test object such as a wafer to apply electric signals to the conductive pad. All ends of the probe tips must be disposed at the same height such that all the probe tips contact the pad. The probe tips protrude downwardly from the bottom of a space transformer. However, if a thickness of a space transformer 42 is not even as illustrated in FIG. 1, the ends of probe tips 46 have different heights although the space transformer 42 is disposed horizontally. For this reason, a loose contact occurs between a pad and the probe tip 46 during a test.

FIG. 2 is a cross-sectional view of a conventional probe card configured for controlling a level of the bottom of a space transformer 42. A top reinforcement member 30 is provided to a top surface of a printed circuit board (PCB) 10 and a bottom reinforcement member 20 is provided to a bottom surface thereof. The top reinforcement member 30 is a disk-shaped member, and the bottom reinforcement member 20 is a ring-shaped member. These reinforcement members 20 and 30 are fixed by means of a bolt 70. An installation member 40 is provided to the inside of the bottom reinforcement member 20. The installation member 40 includes a space transformer 42 with a probe tip 46 and a support plate 44 disposed to hold the space transformer 42. The support plate 44 is coupled with the bottom reinforcement member 20 by means of a plate spring 50. A plurality of holes 12 are formed at the top reinforcement member 30 and the PCB 10. A plurality of fine-tunable control bolts 60 are inserted into the holes 12, respectively. The insertion degree of the respective control bolts 60 is controlled to adjust a force applied to press the space transformer 42. Thus, the level of the bottom of the space transformer 42 is controlled. As illustrated in FIG. 3, a press force F1 applied from a control bolt 60 is counterpoised to a press force F2 applied from a support plate 44 to a plate spring 50 by a restoring force to fix a position of a space transformer 42. Elastic means such as a pogo pin 80 is provided between a PCB 10 and the space transformer 42 for their electric connection.

Generally, a test process is conducted while a wafer is heated. If the above-described probe card is used for a long while, the plate spring 50 is deformed to change an elastic modulus of the plate spring 50. As a result, a restoring force of the plate spring 50 is also changed to deteriorate a controlled level of the space transformer 42. Further, a number of components such as a plurality of plate springs 50, a top reinforcement member 30, and a bottom reinforcement member 50 are used to require a long time for assembling or maintaining a probe card.

DISCLOSURE OF INVENTION

Technical Problem

Exemplary embodiments of the present invention are directed to a probe card.

Technical Solution

In an exemplary embodiment, the probe card may include an installation member having a bottom surface to which probe tips are provided for electrically contacting a test object; a printed circuit board (PCB) having top and bottom surfaces on which electrically connected pads are disposed, respectively; interconnection members disposed between the installation member and the PCB to electrically connect the pad disposed on the bottom surface of the PCB with the probe tips; a reinforcement member disposed over the PCB to define a space between the reinforcement member and the PCB and coupled with the PCB; a contact member provided into the space and having a top surface partially or entirely contacting the reinforcement member; a connect member inserted into an insert hole formed at the PCB to couple the contact member with the installation member; and a plurality of control members inserted into control holes formed at the installation member, the PCB, and the reinforcement member for controlling the level of the installation member and fixing the installation member to the PCB, wherein the insertion depth of the respective insert holes is finely tunable.

In another exemplary embodiment, the probe card may include an installation member having a bottom surface to which probe tips are provided for electrically contacting a test object; a printed circuit board (PCB) having top and bottom surfaces on which electrically connected pads are disposed, respectively; interconnection members disposed between the installation member and the PCB to electrically connect the pad disposed on the bottom surface of the PCB with the probe tips; a reinforcement member disposed the PCB when they are coupled with each other; and a plurality of control bolts provided, to the reinforcement member through a control hole formed at the PCB, for controlling the level of the respective probe tips and fixing the installation member to the reinforcement member, the control bolts being inserted into control holes with screw threads in a bottom-to-top direction to finely tune their insertion depths.

Advantageous Effects

In a probe card according to an embodiment of the present invention, a plate spring is not used to maintain a controlled level of a space transformer. Therefore, it is possible to prevent the controlled level of the space transformer from changing due to thermal deformation of the plate spring during a process.

In a probe card according to another embodiment of the present invention, a space transformer and a contact member are fixed and a top surface of the contact member is in contact with a reinforcement member. Therefore, it is possible to prevent a controlled level of the space transformer from changing due to a force generated when a probe tip contacts a wafer during a test process.

According to the present invention, a probe card has a simple configuration. Therefore, it is possible to readily assemble and maintain the probe card.

BRIEF DESCRIPTION OF THE DRAWINGS

FIG. 1 shows problems arising from use of a conventional probe card.

FIG. 2 is a cross-sectional view of a conventional probe card.

FIG. 3 shows a force applied to the probe card illustrated in FIG. 2 when the probe card is used.

FIG. 4 is a perspective view of a probe card according to the present invention.

FIG. 5 is a cross-sectional view taken along a line I-I of FIG. 4.

FIG. 6 is a perspective view of a probe card illustrated in FIG. 5.

FIG. 7 through FIG. 11 illustrate a procedure of assembling a probe card.

BEST MODE FOR CARRYING OUT THE INVENTION

The present invention will now be described more fully hereinafter with reference to the accompanying drawings, in which preferred embodiments of the invention are shown. This invention, however, may be embodied in many different forms and should not be construed as limited to the embodiments set forth herein. In the drawings, the shapes of elements are exaggerated for clarity.

A probe card 1 according to the invention is used to test electric characteristics of test objects such as semiconductor wafers. FIG. 4 is a perspective view of a probe card according to the invention. FIG. 5 is a cross-sectional view taken along a line I-I of FIG. 4, and FIG. 6 is a perspective view of a probe card illustrated in FIG. 5.

Referring to FIG. 4 through FIG. 6, a probe card 1 includes an installation member 100, a printed circuit board (PCB) 200, a reinforcement member 300, a contact member 400, a connect member 500, and a control member 600.

The installation member 100 is a disk-shaped member and has probe tips 160 that come in contact with a pad disposed on a wafer (not shown) during a process to apply an electric signal to the pad. The installation member 100 includes a space transformer 120 where the probe tips 160 are installed and a support plate 140 configured for holding the space transformer 120. The space transformer 120 has a disk shape, and the probe tips 160 protrude downwardly from the bottom surface of the space transformer 120. A side of the space transformer 120 is stepped such that a top end thereof more protrudes outwardly than a bottom end thereof. The probe tips 160 may be fabricated independently of the space transformer 120 before being coupled or merged with the space transformer 120. A plurality of pads 122 are disposed on a top surface of the space transformer 120. Inside the space transformer 120, signal lines (not shown) are formed to electrically connect the probe tips 160 with the pads 122. The support plate 140 is a ring-shaped plate 140, which is disposed to surround the space transformer 120 in a lateral direction. An inner side of the support plate 140 is stepped such that a top end thereof more protrudes inwardly than a bottom end thereof. While the top end protruding in a lateral direction of the space transformer 120 is placed on the bottom end protruding inwardly, the space transformer 120 is fixedly coupled to the support plate 140 by means of a bolt (not shown). Alternatively, shapes of the space transformer 120 and the support plate 140 may change such that the space transformer 120 is forcibly and fixedly coupled to the support plate 140.

A printed circuit board (PCB) 200 is mounted over the space transformer 120. Pads 201 and 202 are provided to top and bottom surfaces of the PCB 200, respectively. The PCB 200 has a disk shape and a longer diameter than the support plate 140. A plurality of interconnect member such as pogo pins 220 are provided to the bottom surface of the PCB 200. Each of the pogo pins 220 is made of a metal to have a conductivity and has top and bottom ports and a spring provided for connecting the top and bottom ports with each other. The pogo pins 220 are provided for interconnecting a pad 122 disposed on the top surface of the PCB 200 and a pad 201 disposed on the bottom surface of the PCB 200. More specifically, the pad 201 is disposed on the bottom surface of the PCB 200 and the pad 202 is disposed on the top edge of the PCB 200. Signal lines (not shown) are provided inside the PCB 200 for electrically connecting the pad 201 to the pad 202. A separate test equipment (not shown) is electrically connected to the pad 202 of the PCB 200.

A reinforcement member 300 is mounted on the PCB 200. The reinforcement member 300 is a cylindrical member having a bottom-open space 302. A plurality of coupling grooves 322 are formed at the sidewall of the reinforcement member 300, having screw threads. Coupling holes 242 are provided at the PCB 200 to face the coupling grooves 322. A bottom surface of the reinforcement member 300 is roughly flat. In an upward direction, a bolt 280 is inserted into the coupling hole 242 and the coupling groove 322 to fix the reinforcement member 300 to the PCB 200.

When the reinforcement member 300 and the PCB 200 are coupled with each other, they define a space 302 in which a contact member 400 is provided. A top surface 440 of the contact member 400 is disposed to an inner surface of the reinforcement member 300. The contact member 400 has a bottom surface 420 and the top surface 440. The bottom surface 420 of the contact member 400 is a circular flat surface, and the top surface 440 thereof is upwardly tapered from edge to the center. A plurality of insert holes 244 are formed at the PCB 200 to penetrate up and down. The insert holes 244 is formed to be inner than the coupling holes 242.

A connect member 500 is inserted into the insert hole 244, connecting the contact member 400 with the support plate 140. The connect member 500 is a rod-shaped member. A hole 522 having a screw thread is formed to penetrate the connect member 500 in a length direction. The connect member 500 has a larger length than a thickness of the PCB 200. When the connect member 500 is inserted into the insert hole 244, the top end of the connect member 500 protrudes toward the top surface of the PCB 200 and the bottom end thereof protrudes toward the bottom surface of the PCB 200. The contact member 400 and the support plate 140 has holes 460 and 144 where screw threads are formed at a position corresponding to a hole 522 formed at the connect member 500. In an downward direction, a bolt 540 is inserted into a hole 460 formed at the contact member 400 and a hole 522 formed at the connect member 500. In an upward direction, a bolt 560 is inserted into a hole 144 formed at the support plate 140 and a hole 522 formed at the connect member 500. Due to the bolts 540 and 560, the connect member 500 is fixed to the contact member 400 and the support plate 140.

When the connect member 500 is inserted into the insert hole 244, the insert hole 244 is wider than the connect member 500 such that the connect member 500 is inclined at a predetermined angle in the insert hole 244. For example, if the insert hole 244 and the connect member 500 have circular cross sections, the insert hole 244 has a larger diameter than the connect member 500. In some cases, the space transformer 120 is fabricated to change its thickness from one side to the other side due to the error arising from its fabricating process. For this reason, ends of probe tips may not have the same height even when the space transformer 120 is horizontally installed on the PCB 200. The control member 600 is provided for connecting the installation member 100 with the reinforcement member 300. The control member 600 is repeatedly tightened and loosed by an operator to control the level of the bottom surface of the space transformer 120 such that the ends of the probe tips 160 have the same height.

More specifically, the control member 600 plays a role in fixing the installation member 100 to the reinforcement member 300. Optionally, a special fixing member such as a bolt (not shown) may be used to fully fix the control member 600 and the installation member 100 to each other.

A control hole 246 is formed between the coupling hole 242 and the insert hole 244 of the PCB 200 to penetrate up and down. Control holes 324 and 146 with screw threads are formed at the reinforcement member 300 and the support plate 140 to face the control hole 246, respectively. A control member 600 is inserted into the control holes 324 and 146. An insertion depth of the control member 600 is finely tunable. The control member 600 may be a control bolt. Screw threads are formed at the control holes 324 formed at the reinforcement member 300 at fine regulars to finely tune the level of the bottom surface of the space transformer 120. The number of control bolts 600 is three to five. In the case where at most two control bolts 600 are provided, it is difficult to control the level. On the other hand, in the case where at least six control bolts are provided, lots of time is required for controlling the level. However, at least six bolts 600 may be provided to control the level more precisely and stably. The control bolts 600 are arranged to make a regular polygon. Alternatively, the control bolts 600 may be arranged to make a polygon.

As discussed above, the probe card 1 according to the invention includes the contact member 400 whose top surface partially contacts the reinforcement member 300. Consequently, a top-to-bottom force is generated at a contact point of the reinforcement 300 and the contact member 400 when a bottom-to-top force is applied at a contact point of probe tips 160 and a pad disposed at a wafer during a test process. Due to the generation of the top-to-bottom force, the controlled level of the space transformer 120 is not changed.

Until the top surface of the contact member 400 contacts the reinforcement member 300, the control bolts 600 are inserted into the control holes 146, 246, and 324 to couple the installation member 100, the PCB 200, and the reinforcement member 300 with one another. At this point, ends of the probe tips 160 have different heights, which results from various causes that the level of the space transformer 120 is not maintained or a thickness of the space transformer 120 is not uniform even when the insertion depth of the control bolts 600 is equal to maintain the level of the space transformer 120 (see FIG. 10). Therefore, the level of the bottom surface of the space transformer should be maintained such that the ends of the probe tips 160 have the same heights, which is accomplished by precisely controlling an insertion depth of the respective control bolts 600. Thus when the space transformer 120 loses its balance to be inclined, the connect member 500 and the contact member 400 are also inclined. However, since the top surface 440 of the contact member 400 is upwardly tapered down from the edge to the center and the reinforcement member 300 has a flat top surface contacting the top surface 440 of the contact member 400, contact of the contact member 400 and the reinforcement member 300 is maintained even when the contact member 400 is inclined. Further, since the insert hole 244 has a larger diameter than the connect member 500, the connect member 500 may be inclined within the insert hole 244. Further, since the pogo pin 220 includes a spring therein, contact of a pad 122 disposed thereon and a pad 201 below the PCB 200 is maintained even when the space transformer 120 is inclined (see FIG. 11).

As described in the exemplary embodiment, the contact member 400 has the shape of a partial section of a sphere. However, a contact member may have a fully spherical shape or a variety of shapes to continuously contact a reinforcement member even while the level of a space transformer is controlled.

In a typical probe card, the controlled level of a space transformer is maintained due to a restoring force of a plate spring. Therefore, an elastic modulus of the plate spring is changed during a test process conducted at a high temperature to change the controlled level of the space transformer. However, a probe card 1 according to the present invention does not include a plate spring provided for maintaining a controlled level of a space transformer 120. Therefore, it is possible to prevent the controlled level of the space transformer 120 from changing due to a thermal deformation during a process.

In the probe card 1, the space transformer 120 and a contact member 400 are fixed and a top surface of the contact member 400 contacts a reinforcement member 300. Therefore, it is possible to prevent the controlled level of the space transformer 120 from changing due to a force generated when a probe tip contacts a wafer during a test process.

FIG. 7 through FIG. 11 illustrate a procedure of assembling the probe card 1 shown in FIG. 5. A connect member 500 is fixed to a contact member 400 (FIG. 7). The connect member 500 is inserted into an insert hole 244 formed at a printed circuit board (PCB) 200 to locate the contact member 400 on a top surface of the PCB 200 (FIG. 8). A reinforcement member 300 is fixed to the PCB 200, and an installation member 100 disposed below the PCB 200 is fixed to the connect member 500 (FIG. 9). Control members 600 are inserted into control holes 146, 246, and 324 formed at the PCB 200 and the reinforcement member 300 down to a position where the contact member 400 contacts the reinforcement member 300, coupling them with one another (FIG. 10). An insertion depth of the respective control members 600 is adjusted to control the level of a space transformer 120 (FIG. 11).

INDUSTRIAL APPLICABILITY

According to the above-described probe card, a controlled level of a space transformer is not changed. Therefore, the probe card is available in testing electric characteristics of semiconductor chips.

The invention claimed is:
1. A probe card comprising:
an installation member having a bottom surface to which probe tips are provided for electrically contacting a test object;
a printed circuit board (PCB) having top and bottom surfaces on which electrically connected pads are disposed, respectively;

interconnection members disposed between the installation member and the PCB to electrically connect the pad disposed on the bottom surface of the PCB with the probe tips;

a reinforcement member disposed over the PCB to define a space between the reinforcement member and the PCB and coupled with the PCB;

a contact member provided into the space and having a top surface partially or entirely contacting the reinforcement member;

a connect member inserted into an insert hole formed at the PCB to couple the contact member with the installation member; and a plurality of control members inserted into control holes formed at the installation member, the PCB, and the reinforcement member for controlling the level of the installation member and fixing the installation member to the PCB, wherein an insertion depth of the respective control members is finely adjustable.

2. The probe card of claim 1, wherein the control members are bolts, and screw threads are formed at the control holes formed at the reinforcement member, the bolts being inserted into the control holes formed at the installation member, the PCB, and the reinforcement member sequentially in a bottom-to-top direction.

3. The probe card of claim 2, wherein the top surface of the contact member becomes convex upwardly.

4. The probe card of claim 3, wherein a bottom surface of the reinforcement member provided for defining the space has a flat shape.

5. The probe card of claim 1, wherein a cross-sectional area of the insert hole is larger than a cross-sectional area of the connect member such that the connect member is inclined within the insert hole formed at the PCB.

6. The probe card of claim 5, wherein the installation member comprises:

a space transformer where the probe tips are installed; and a support plate provided for surrounding and supporting the space transformer and coupled with the connect member, the support plate having control holes into which the control members are inserted.

7. The probe card of claim 5, wherein the number of the control members is three to five.

* * * * *